Nov. 23, 1965 D. B. JAMES 3,219,994

DIODE LOGARITHMIC ENCODER

Filed Nov. 8, 1960 2 Sheets-Sheet 1

INVENTOR
D. B. JAMES
BY Harry C. Hart
ATTORNEY

Nov. 23, 1965 D. B. JAMES 3,219,994

DIODE LOGARITHMIC ENCODER

Filed Nov. 8, 1960 2 Sheets-Sheet 2

INVENTOR
D. B. JAMES
BY Harry C. Hart
ATTORNEY

3,219,994
DIODE LOGARITHMIC ENCODER

Dennis B. James, Bernardsville, N.J., assignor to Bell Telephone Laboratories, Incorporated, New York, N.Y., a corporation of New York Filed Nov. 8, 1960, Ser. No. 67,990
22 Claims. (Cl. 340—347)

This invention relates to the adaptation of counter encoders to the logarithmic encoding of pulse amplitude signals and more particularly to such logarithmic encoding in which negative resistance diodes are employed as active elements.

Pulse amplitude signals obtained by the sampling of a message wave are commonly encoded into trains of uniform amplitude pulses before being transmitted in order that the noise added by a transmission channel may be removed on reception. In counter encoders the number of pulses making up each pulse train is determined by counting the number of cycles generated by an oscillator during a time interval controlled by the amplitude of the pulse signal being encoded.

Since it is essential that the frequency of the oscillator be relatively constant during the encoding interval, it has been common practice to operate the oscillator continuously and to apply its output signal to the counter through a gate that is actuated by a control circuit. This arrangement is attended by oscillator and output gating complexity. Accordingly, it is an object of the invention to simplify the operation of a counter encoder by having its control circuit operate the oscillator directly instead of in conjunction with an output gate. A related object is to simplify the configuration of the oscillator through the use of a single active element whose coordination with the control circuit assures high constancy of the generated oscillations.

When the control circuit is a converter that derives a pulse duration signal from each pulse amplitude signal applied to the encoder, control of the oscillator is effected through detection and gating at the commencement and at the termination of each pulse duration signal. Conventionally this has required separate control gates. Accordingly, it is a further object of the invention to simplify the control circuit of a counter encoder by eliminating the need for multiple control gates. A related object is the coordination of rapid detection and gating in a single active element.

Once generated, encoded information is typically applied to a transmission channel. To increase the capacity of the channel, a counter encoder is advantageously provided with a compression characteristic that prevents signals with substantial amplitudes from requiring unduly large counts. On the other hand, it is desirable that the differential between the counts of small amplitude signals be substantial in order that quantization error be minimal. A logarithmic compression characteristic satisfies both of these requirements and simultaneously provides a suitable distribution of signal-to-noise ratio for all signal levels. Accordingly, it is a still further object of the invention to incorporate a logarithmic compression characteristic into the control circuit of a counter encoder for which multiple control gates have been eliminated.

A control circuit incorporating a discharge path for a stored signal would appear to be suited to logarithmic compression. In such a circuit a logarithmic relation exists between the amplitude of the stored signal and its discharge interval. However, that interval is of a theoretically infinite duration, regardless of the amplitude of the stored signal. And the logarithms of magnitudes less than unity, being negative, are not directly representable by any discharge interval. Consequently, it is an important object of the invention to so adapt a discharge path that it provides a prescribed and finite discharge interval that increases in a logarithmic fashion according to the amplitude of a stored signal. An associated object is to constrain the discharge interval to a negligible duration for stored signals of negligible amplitude.

The invention is characterized by the controlled biasing, through the use of a discharge path in a control network, of an oscillator whose principal constituent is advantageously a negative resistance diode with peak and valley thresholds separating the active and inactive regions of its current-voltage characteristic.

Included in the discharge path, along with a component for storing the sampled signals to be encoded, is a negatively biased switching component, desirably a negative resistance diode of the kind used in the oscillator. Such a diode rapidly switches to a signal state either above or below its thresholds according to the magnitude of the stored signal.

In order that the switching diode be responsive to small amplitude signals, its current-voltage characteristic is adjusted by a compensator so that the control circuit load line presented to the compensated characteristic, for a stored signal of zero amplitude, lies just below the valley threshold. Consequently, the storage of an incremental signal causes the signal level of the control network to exceed the peak threshold of the compensated characteristic and result in a rapid change in the signal states of the switching diode. Thereafter, the discharge of the stored signal causes the signal level of the control circuit to fall below the valley threshold of the switching diode which is returned to its initial state.

The output of the switching diode, absent a stored signal, is applied to the oscillator through a divider network that is adjusted to place the operating point of the oscillator in the inactive region of the diode current-voltage characteristic. Subsequently, a change in signal state of the switching diode, occasioned by a stored signal, produces a shift of the oscillator operating point into the active region of the oscillator diode characteristic.

During the discharge of the stored signal, the oscillator operating point is shifted negligibly and the oscillator frequency is maintained relatively constant. But, during switching, the rapidity of the change in the signal state of the switching diode causes the oscillator operating point to move with like rapidity between its active and inactive regions and prevents any intervening nonlinearity of the oscillator characteristic from substantially affecting the frequency of the generated oscillations. Since the switching diode controls the oscillator directly, it acts as a combined detector and control gate and it eliminates the need for an oscillator output gate.

As a result of the negative biasing of the switching diode and the compensation accorded its characteristic, the discharge of the storage component to a zero level is of a controlled duration which is negligible for an incremental signal of negligible amplitude and increases in a logarithmic fashion according to the amplitude of the stored signal.

A buffer may be added to the encoder to isolate the oscillator from the control circuit. Alternatively, the compensator may be adjusted so that the equivalent impedance and signal level presented to the switching diode are identical with those of the compensator alone, when isolated from the oscillator by a buffer.

The accomplishment by the invention of the above and related objects will be apparent after a consideration of an illustrative embodiment taken in conjunction with the drawings in which.

Figure 1:
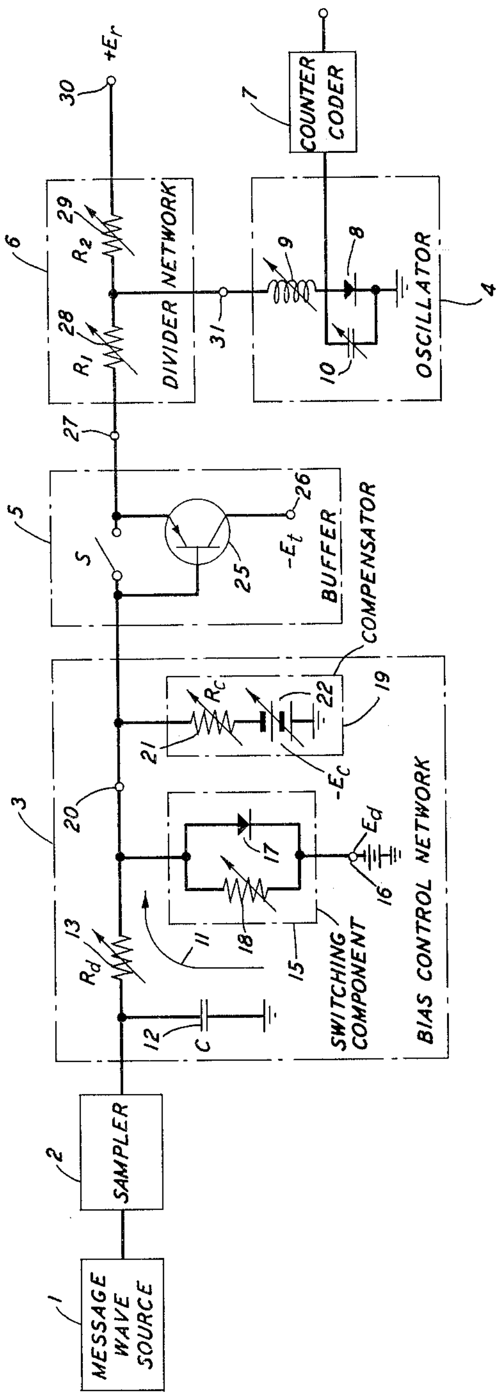
FIG. 1 is a composite block and wiring diagram of a logarithmic encoder employing a voltage controlled negative resistance diode for switching and a like diode for generating oscillations.

Turn now to the encoder of FIG. 1. There, each pulse amplitude signal received from a message wave source 1 by way of a sampler 2 is converted by a bias control network 3 into a pulse duration signal that in turn activates an oscillator 4 through a buffer 5 and a divider network 6. A counter coder 7 monitors the oscillator 4 during its active intervals to determine the number of cycles generated. While binary outputs are common for the counter coder 7, the kind of count produced depends upon the type of code to be transmitted.

The oscillator 4 employs a voltage-controlled diode having a current-voltage characteristic with at least one active region of negative resistance flanked by inactive regions of positive resistance. When biased beyond an operating threshold of demarcation between its active and inactive regions and because of its inherent capacitance and inductance, the diode 8 is ordinarily capable of generating sustained oscillations through an adjustment of its load alone. However, auxiliary resonant elements, namely an adjustable series inductor 9 and an adjustable shunt capacitor 10, are needed on occasion to meet the criteria set forth by M. E. Hines in the Bell System Technical Journal, 1960, volume 39, page 477. In any event the auxiliary elements 9 and 10 permit selection of an arbitrary resonant frequency.

To furnish the oscillator 4 with a pulse duration signal, the control network 3 employs a discharge path, partially indicated by the loop current symbol 11. The path includes a capacitor 12 for storing each pulse amplitude signal provided by the sampler 2, a discharge resistor 13, a switching component 15, and a discharge-control source of negative voltage $-E_d$ at terminal 16. The switching component 15 is conveniently a voltage-controlled negative resistance diode 17 similar to that used in the oscillator 4. Its current-voltage characteristic is subject to a twofold adjustment, one by a shunting padding resistor 18 and another by a compensator 19 connected to the discharge path at a nodal point 20 of the switching component 15. As explained subsequently, the switching diode 17 is made operative for sampled signals of small magnitude through adjustment, in the compensator 19, of a series connected compensating resistor 21 and a source 22 of negative compensating voltage $-E_c$.

Adjustment of the compensator 19 is facilitated if switching interaction is prevented by isolating the control network 3 from the oscillator 4. Suitable isolation is afforded by interconnecting the control and divider networks 3 and 6 through a buffer 5 which presents a substantial impedance to the switching diode 17 and a negligible impedance to the oscillator diode 8. The buffer 5 is conveniently an emitter follower transistor 25 with a negative collector voltage $-E_t$ applied at terminal 26. However, a setting of the compensator 19 is determinable that eliminates the need for the buffer 5. This is done by closing the buffer bypass switch S and readjusting the compensator 19 to provide the same equivalent impedance and signal level at the switching diode 17 as were required before closure of the switch S.

Whether or not isolated by a buffer 5, the output of the control network 3 is of a negative polarity that cannot bias the oscillator 4 directly. Instead, the control voltage is applied to the control terminal 27 of a divider network 6 containing series combined divider resistors 28 and 29 which are supplied with a positive signal level $+E_r$ at a reference terminal 30. The reference voltage $+E_r$ and the resistive magnitudes $R_1$ and $R_2$ of the divider resistors 28 and 29 are adjusted to cause the voltage appearing at the oscillator terminal 31 of the divider network 6 to be negligible in the absence of a sampled signal applied to the control network 3. With the buffer switch S open, there is a negligible impedance contribution at the control terminal 27 attributable to the control network 3 and the voltage appearing at the oscillator terminal 31 is substantially the average of voltages applied to the control and reference terminals 27 and 30 as weighted in proportion to the resistive magnitudes $R_1$ and $R_2$ of the divider resistors 28 and 29. Consequently, when the control voltage becomes less negative as a result of switching action adduced by the storage of a sampled signal, the voltage level at the oscillator terminal 31 becomes more positive and thus enables the oscillator 4 to be biased in the active region of its diode characteristic.

Figure 2:
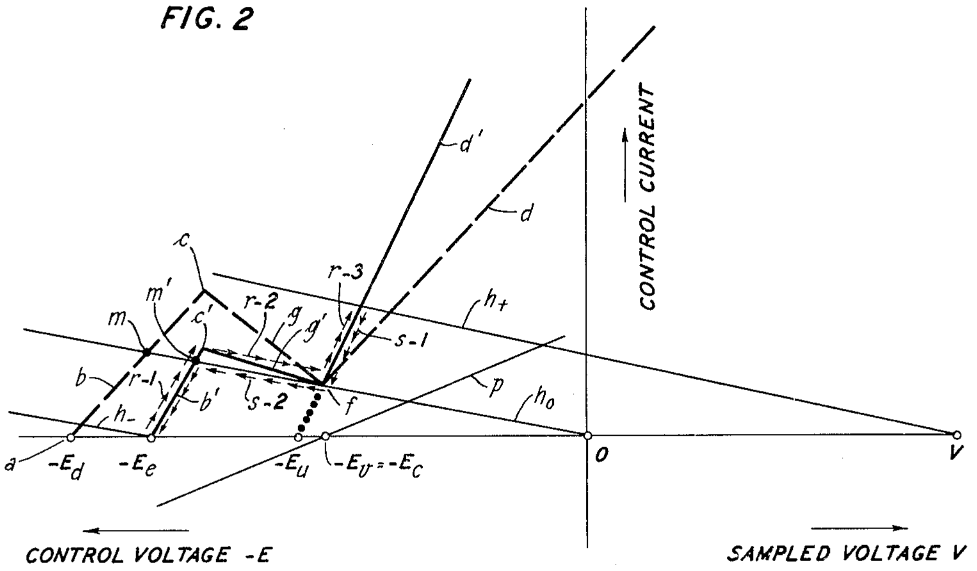
FIG. 2 is a set of characteristic and load curves explanatory of switching action in the control network of a logarithmic encoder.

To understand the operation of the encoder and the role of the control network 3, refer to the curves of FIG. 2. The curve corresponding to the current-voltage characteristic of a typical switching diode 17 (FIG. 1), as augmented by its padding resistor 18 is indicated by dashed lines. It originates along the axis of abscissas at the point *a* corresponding to the magnitude of the discharge-control voltage $-E_d$. The diode curve displays a first region *b* of positive resistance terminated at a peak threshold *c*, a second region *d* of positive resistance commencing at a valley threshold *f* and a region *g* of negative resistance extending between the thresholds *c* and *f*. For simplicity, the switching diode characteristic has been idealized with linear segments and its positive resistance regions *b* and *d* are shown with like slopes. When the switching diode 17 (FIG. 1) is uncompensated and its buffer 5 operative, the operating condition of the diode 17 is then given by the intersection of its characteristic with a control load line *h*. That load line *h* is represented by a linear segment originating along the axis of abscissas at a position corresponding to the voltage stored by the capacitor and having a slope determined by the resistive magnitude $R_d$ of the discharge resistor 13.

For reasons which will appear shortly it is desirable that the control load line $h_0$ for stored signals of negligible amplitude closely approach the valley threshold *f* of the diode characteristic. In that case, however, the intersection *m* of the control load line $h_0$ with the first region *b* of the characteristic generally lies below the peak threshold *c*. As a result, encoding is prevented for sampled signals whose amplitudes are insufficient to shift the control load line $h_0$ beyond the peak threshold *c*.

To permit encoding over substantially the full amplitude range of sampled signals, the diode characteristic is compensated so that the resulting peak threshold *c'* is brought into approximate coincidence with a point of the control load line $h_0$ originating at the zero position along the axis of abcissas. In deriving the compensated characteristic, the compensator voltage $-E_c$ is conveniently made equal to the valley threshold voltage $-E_v$ of the uncompensated characteristic, after which the slope of the compensator characteristic *p* equal to the reciprocal of the compensator resistive magnitude $R_c$ is adjusted to set the compensated diode characteristic, indicated by reinforced solid lines, for an approximate coincidence condition at position *m'*. Exact coincidence is undesirable since it reduces the switching speed of the switching diode and leads to unstable operation in the resistance region. Then the compensated and uncompensated valley threshold voltages $-E_v$ are identical and the resistive regions *b'*, *g'* and *d'* of the compensated characteristic have reciprocal slopes determined by the parallel combination of the compensator resistance $R_c$ and the uncompensated diode resistance. The fact that the zero level load line $h_0$ passes near the compensated peak threshold *c'* cannot lead to premature encoding due to noise disturbances inasmuch as the position of the load line *h*— corresponding to the absence of a sampled signal is established by the initial negative equilibrium voltage $-E_e$ stored by the capacitor 12 of FIG. 1.

With the presence of a positive polarity sampled signal the negative charge stored by the capacitor 12 is quickly neutralized and the operating condition of the compensated diode rapidly moves along the first portion *r*–1 of its charging locus to the peak threshold *c'*. At the peak threshold *c'* the charging locus encounters the negative resistance region *g'* of the compensated characteristic and as a result makes a rapid transition along its second portion *r*–2 to the second positive resistance region *d'*. Charging continues along the third portion *r*–3 of the charging locus until there is full storage of the sampled signal corresponding to the completely shifted load line *h*+. For all practical purposes the transition from the equilibrium voltage level $-E_e$ to the full storage voltage level V, determined by the magnitude of the sampled signal, takes place instantaneously as indicated by the charge region *aa* of the charge-discharge curve of FIG. 3.

At the end of the sampling interval the capacitor 12 of FIG. 1 begins to discharge and the diode operating condition indicated in FIG. 2 approaches the valley threshold *f'* along the first portion *s*–1, a discharge locus. When the net charge on the capacitor corresponds to zero voltage, the control line *h* falls below the valley threshold *f* and, because the negative resistance characteristic *g'* of the compensated diode, the second portion *s*–2 of the discharge locus makes a rapid transition to the first positive resistance region *b'* of the compensated characteristic.

Figure 3:
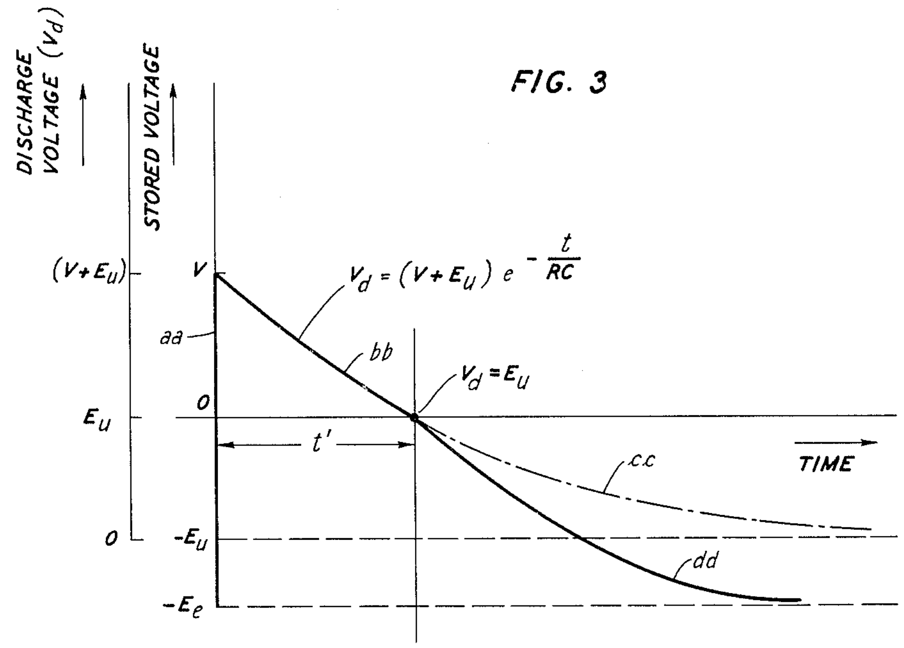
FIG. 3 is a discharge curve associated with the switching action of the control network and illustrative of logarithmic compression.

In the solid line charge-discharge curve of FIG. 3 the first discharge portion *bb* of the curve corresponds to that part *s*–1 of the discharge locus of FIG. 2 confined to the second positive resistance region *d'*. Were it not for the switching, the discharge portion of the charge-discharge curve would have an extension *cc* that would asymptotically approach an upper level voltage $-E_u$ which may be approximated by the magnitude (in FIG. 2) corresponding to the intersection of the axis of the abcissas with the extension of the positive resistance region *d'*. However, when the discharge voltage $V_d$ reaches the magnitude of the upper level voltage $E_u$, which is the zero level of the stored voltage, the sudden transition from the second region *d'* of positive resistance to the first region *b'* of positive resistance is reflected by an abrupt change of curvature manifested by the second discharge portion *dd* of the charge-discharge curve in FIG. 3 which asymptotically approaches the intial equilibrium voltage $-E_e$ of the compensated diode.

During the storage of a sampled signal by the encoder of FIG. 1, the change in control voltage level E (FIG. 2) of the control network 3 is matched by a corresponding change in the bias voltage applied to the oscillator 4. When the buffer 5 is operative and the divider resistors 28 and 79 have substantially equal magnitudes, the resultant oscillator bias voltage switches rapidly between the average of the equilibrium and reference voltages $-E_e$ and $+E_r$ and the average of the upper level and reference voltages $-E_u$ and $+E_r$ Since these transitions take place rapidly, the non-linearities of the oscillator diode characteristic between the inactive and the active bias levels are prevented from appreciably altering the frequency of the generated oscillations. Additionally, the substantial slope of the second positive resistance region *d'* prevents the magnitude of the sampled voltage V from significantly changing the net biasing voltage applied to the oscillator during its operating interval.

However, the magnitude of the sampled voltage V does have the desired control over the time of discharge as can be seen from the charge-discharge curve of FIG. 3. While the stored voltage is decaying to the upper level voltage $E_u$, the discharge voltage $V_d$ corresponding to the first portion s–1 of the discharge locus and its hypothetical extension to the axis of abcissas is given by:

$$V_d=(V+E_u)e^{-\left(\frac{t}{RC}\right)} \qquad (1)$$

where $t$=discharge time

R=the resistive magnitude presented by the discharge path, being the series combination of the resistive magnitude $R_d$ of the discharge resistor and the resistive magnitude corresponding to the slope of the compensated diode characteristic and C=capacitive magnitude of the storage capacitor.

On the occurrence of switching, that is when the capacitor 12 stores a zero level signal, the discharge voltage $V_d$ is seen to be the upper level voltage $E_u$. Consequently, the active discharge interval is obtained by equating the upper level voltage $E_u$ with the discharge voltage $V_d$ of Equation (1) and solving for the discharge time $t'$:

$$t'=RC\ \ln\left(\frac{V}{E_u}+1\right) \qquad (2)$$

where R and C are as in Equation (1).

Thus, the time interval during which the oscillator 4 of FIG. 1 generates an output signal is proportional to the logarithm of an argument constituted of unit magnitude plus a magnitude proportional to the amplitude of the sampled signal. Likewise, the number of counts recorded by the counter coder is a corresponding function of the logarithm. Since the encoded magnitude contains a normalized signal level of unit magnitude, it is possible to encode sampled signals having less than unit magnitude without obtaining negative logarithms. Removal of the normalized signal level during decoding may be accomplished by conventional logarithmic decoders or by adapting the discharge circuit of the instant encoder for decoding.

While the operation of the encoder has been illustrated for samples of but one polarity, the invention is readily adapted to the encoding of the sampled signals irrespective of polarity by an expendient such as the use of a full wave rectifier at the message wave source, coupled with a path that provides the output of the counter coder with a prefix signal indicative of polarity.

Many techniques for implementing the switching component of the discharge path, as well as for compensating that component to permit substantially full range encoding of pulse amplitude signals, will occur to those skilled in the art. Also of relevant applicability will be many devices for biasing the oscillator, as well as for isolating it from its control network.

What is claimed is:

1. Apparatus for logarithmically coding a signal wave which comprises means for deriving, at consecutive sampling instants, samples of successive amplitudes of the signal wave, a storage condenser, a low resistance path extending from said sampling means to said condenser, means for substantially instantaneously charging said condenser with said successive amplitude samples, a discharge path, of substantially higher resistance than that of said low resistance path, extending from said condenser to a fixed potential point and including as an element a voltage-controlled diode characterized by two distinct states of conduction, said diode being thus driven to its second state when the condenser is charged and being returned to its first state when the condenser is discharged, said condenser and said discharge path being proportioned to provide a discharge time for said condenser less than the intersample interval, a constant frequency oscillator of which the active element is a second voltage-controlled diode having a negative resistance characteristic and a threshold of operation, a coupling path extending from said first diode to said second diode, the characteristic of said second diode being so coordinated with the characteristic of said first diode that passage of said first diode from its first state to its second state drives said second diode from below its threshold of operation to above its threshold of operation, and passage of said first diode from its second state to its first state drives said second diode from above its threshold of operation to below its threshold of operation, whereby successive discharges of said condenser through said first diode cause successive oscillation trains of said oscillator, and whereby the numbers of full cycles in the successive trains are proportional to the logarithms of the amplitudes of the signal wave at the successive sampling instants.

2. Apparatus for encoding a sampled signal, which comprises means for storing the sampled signal, switching means, first means for coupling said storage means to said switching means and for causing said switching means to adopt a first signal state in response to the storage of said sample signal, oscillator means, second means for coupling said switching means to said oscillator means and for causing said oscillator means to be activated by a signal corresponding to said first signal state, means for counting the number of cycles generated by the activated oscillator means, and means, included in said first coupling means and interconnecting said storage means with said switching means, for discharging said storage means through said switching means to a prescribed signal level and for causing said switching means to adopt a second signal state whose corresponding signal deactivates said oscillator means, thereby to terminate the operation of said counting means whose output is the encoded counterpart of said sampled signal.

3. Apparatus as defined in claim 2, wherein said second coupling means comprises means for providing said oscillator means with a reference signal, and means for coordinating the signal states of said switching means with said reference signal, thereby to supply said oscillator means with a composite signal which causes it to be activated by a signal corresponding to said first signal state and to be deactivated by a signal corresponding to said second signal state.

4. Apparatus as defined in claim 3, wherein said coordinating means comprises a signal divider network.

5. Apparatus as defined in claim 2, wherein said second coupling means further includes means for isolating said oscillator means from said switching means.

6. Apparatus as defined in claim 2, further including means for compensating said switching means to allow said apparatus to encode sampled signals lying within an extended amplitude range including amplitudes of substantially zero magnitude.

7. Apparatus as defined in claim 6, wherein said compensating means comprises the series combination of a negative polarity voltage source and a compensating resistor, the resistive magnitude of said resistor and the voltage magnitude of said source being so adjusted that said switching means adopts said second signal state for the storage of a sampled signal having a negligible magnitude.

8. Apparatus as defined in claim 2, wherein said discharging means comprises resistive means so proportioned that said switching means adopts said second signal state after a discharge time proportional to the natural logarithm of the argument constituted of unit magnitude plus a magnitude proportional to the magnitude of the stored signal.

9. Apparatus for encoding a sampled signal which comprises discharge-control switching means comprising, a discharge loop which includes storage means, discharge means connected to said storage means, switching means connected to said discharge means and having distinct first and second signal states, and a negative polarity source of discharge-control voltage interconnecting said switching means with said storage means; means for applying the sampled signal to said storage means, thereby to transfer said switching means from the first signal state to the second signal state, said switching means being returned to said first signal state after a discharge interval controlled by said source; oscillator means; and means for causing said switching means to activate said oscillator means during the interval for which said switching means is in said second signal state, whereby the number of oscillations generated during the activated interval of said oscillator means is the encoded counterpart of said sampled signal.

10. Apparatus for converting a sampled analog signal into an oscillatory code signal whose number of cycles depends upon the amplitude of the input signal, which apparatus comprises means for storing the sampled signal, biasing means for providing biasing signal levels lying in a first range terminated by an upper extremity and in a non-adjoining second range commencing with a lower extremity, said biasing means including means for switching between said first range and said second range, oscillator means, activated by said biasing means, for generating an oscillatory signal solely in response to biasing signals in said second range, means interconnecting said storage means with said switching means for discharging said storage means through said switching means at a rate dependent upon the stored amplitude of said sampled signal, whereby the initial storage of said sampled signal causes the signal level of said biasing means to exceed that of said upper extremity and to be switched into said second range, thereby initiating oscillations of said oscillator means, and the subsequent discharge of said storage means causes the signal level of said biasing means to fall below that of said lower extremity and to be switched into said first range, thereby terminating said oscillations.

11. Apparatus for converting a sampled analog signal into an oscillatory code signal which comprises negative resistance means having an inactive, non-oscillatory state and an active, oscillatory state, means for biasing said negative resistance means to said inactive state under the control of signals lying within a first amplitude range and for biasing said negative resistance means to said active state under the control of signals lying within a second amplitude range, said biasing means including means having first and second thresholds for rapidly switching between the first and second ranges in response to switching signals respectively increasing in amplitude beyond the first threshold and decreasing in amplitude below the second threshold, means for storing the sampled signal, and means for coupling said storage means to said switching means, whereby the storage of said sampled signal increases the magnitude of the switching signal beyond said first threshold and rapidly switches the control signals into said second range, thereby initiating oscillations of said negative resistance means, said coupling means including means for discharging said storing means through said switching means at a rate dependent upon the amplitude of said sampled signal, whereby the subsequent decay of the stored signal ultimately decreases the magnitude of said switching signal below said second threshold and rapidly switches said control signals into said first range, thereby terminating said oscillations.

12. Apparatus for generating oscillations under the control of a sampled input signal which comprises, oscillator means having a current-voltage characteristic with a nonoscillatory positive resistance region adjoining an oscillatory negative resistance region, biasing means for causing a load line to intersect said characteristic only in its said positive resistance region, said biasing means including switching means for causing said load line to intersect said characteristic only in its oscillatory region in response to a switching signal exceeding a first threshold and for returning the intersection to said nonoscillatory region in response to a switching signal falling below a second threshold, means for storing the sampled signal, and means for applying the stored signal to said switching means, whereby the storage of said sampled signal causes said switching signal to exceed said first threshold and start the generation of oscillations, and the subsequent discharge of said stored signal ultimately causes said switching signal to fall below said second threshold and stop said oscillations.

13. In an encoder, the combination which comprises first and second voltage controlled diodes, means for biasing the cathode of the first diode negatively with respect to the cathode of the second diode, a three terminal voltage divider network having first and second terminals interconnecting the anodes of said diodes, means for applying a positive voltage to the anode of the second diode through the third terminal of said network, a capacitor connected to a positive pole of said biasing means, and a resistor interconnecting said capacitor with the anode of said first diode for discharging said capacitor through said first diode, thereby to control the condition of said second diode according to the discharge of said capacitor.

14. In an encoder, the combination which comprises a voltage divider network comprising a combination of a first and a second resistor, connected in series, one terminal of said combination being connected to a point of positive potential, a first voltage controlled diode having its anode connected to the other terminal of said combination, said other terminal being connected to a point of negative potential through said first diode, a second voltage controlled diode having its anode connected to the junction point of said series combined resistors, and, interconnecting the anode of said first diode with the cathode of said diode, a branch containing the series combination of a resistor and a capacitor for controlling the condition of said second diode by the discharge of said capacitor through said resistor into said first diode.

15. Apparatus comprising
an input point,
energy storage means connected to said input point,
negative resistance means having a first terminal and a second terminal,
resistance means interconnecting the first terminal of said negative resistance means with said storage means for discharging said storage means into said negative resistance means,
and a path interconnecting the second terminal of said negative resistance means with said storage means.

16. Apparatus as defined in claim 15, further including biasing means included in said path.

17. Apparatus as defined in claim 16, further including second resistive means connected to the first mentioned resistive means, and biasing means interconnecting said second resistive means with said energy storage means.

18. Apparatus as defined in claim 17, further including biasing means connected to said second resistive means, and second negative resistance means interconnecting the third mentioned biasing means with said energy storage means.

19. Apparatus comprising energy storage means, negative resistance means having first and second signal conditions, and respective thresholds of transition between said conditions,
means interconnecting said storage means with said negative resistance means for deenergizing said energy storage means through said negative resistance means,
and means for energizing said energy storage means to exceed the threshold of transition between said first and second signal conditions and set said negative resistance means in its second signal condition for a preassigned fraction of the deenergizing interval of said energy storage means.

20. Apparatus as defined in claim 19, further including means for biasing said negative resistance means to operate in the vicinity of its threshold of transition between said first and second signal conditions for a zero energy-level condition of said energy storage means.

21. Apparatus as defined in claim 20, further including means for biasing said negative resistance means to operate in the vicinity of its threshold of transition between its second and first signal conditions upon the deenergization of said storage means to its zero energy-level condition.

22. Apparatus comprising first negative resistance means having first and second signal conditions, storage means,
means for discharging said storage means into said first negative resistance means to set said first negative resistance means in its second signal condition for a controlled interval,
second negative resistance means having an oscillatory signal condition,
and means for coupling said first negative resistance means to set said second negative resistance means in its oscillatory condition during said controlled interval.

References Cited by the Examiner

UNITED STATES PATENTS

| | | | |
|---|---|---|---|
| 2,662,213 | 12/1953 | Vanderlyn | 328—145 |

MALCOLM A. MORRISON, *Primary Examiner.*

IRVING L. SRAGOW, *Examiner.*